(12) United States Patent
Yuan et al.

(10) Patent No.: US 11,421,322 B2
(45) Date of Patent: Aug. 23, 2022

(54) BLOCKER PLATE FOR USE IN A SUBSTRATE PROCESS CHAMBER

(71) Applicant: APPLIED MATERIALS, INC., Santa Clara, CA (US)

(72) Inventors: Xiaoxiong Yuan, San Jose, CA (US); Yu Lei, Belmont, CA (US); Yi Xu, San Jose, CA (US); Kazuya Daito, Milpitas, CA (US); Pingyan Lei, San Jose, CA (US); Dien-Yeh Wu, San Jose, CA (US); Umesh M. Kelkar, Santa Clara, CA (US); Vikash Banthia, Los Altos, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 330 days.

(21) Appl. No.: 16/520,646

(22) Filed: Jul. 24, 2019

(65) Prior Publication Data
US 2019/0382895 A1 Dec. 19, 2019

Related U.S. Application Data

(63) Continuation of application No. 15/663,734, filed on Jul. 29, 2017, now Pat. No. 10,508,339.

(60) Provisional application No. 62/513,149, filed on May 31, 2017.

(51) Int. Cl.
*C23C 16/455* (2006.01)
*H01L 21/67* (2006.01)

(52) U.S. Cl.
CPC .. *C23C 16/45544* (2013.01); *C23C 16/45508* (2013.01); *C23C 16/45536* (2013.01); *C23C 16/45561* (2013.01); *C23C 16/45563* (2013.01); *C23C 16/45565* (2013.01); *C23C 16/45574* (2013.01); *H01L 21/67017* (2013.01)

(58) Field of Classification Search
CPC ........ C23C 16/45565; C23C 16/45574; C23C 16/45563; C23C 16/45508; C23C 16/45536; H01L 21/67017
See application file for complete search history.

(56) References Cited

U.S. PATENT DOCUMENTS

| | | | |
|---|---|---|---|
| 6,511,577 B1 | 1/2003 | Johnson | |
| 2002/0045362 A1* | 4/2002 | Yang | C23C 16/4412 438/791 |
| 2002/0046808 A1* | 4/2002 | Hongo | C23C 16/511 156/345.41 |
| 2003/0038112 A1* | 2/2003 | Liu | H01J 37/3299 216/60 |
| 2005/0263072 A1* | 12/2005 | Balasubramanian | C23C 16/45574 118/715 |
| 2006/0090700 A1 | 5/2006 | Satoh et al. | |
| 2012/0135145 A1 | 5/2012 | Je et al. | |
| 2016/0319428 A1 | 11/2016 | Rasheed et al. | |
| 2020/0131640 A1* | 4/2020 | Chen | C23C 16/45591 |

* cited by examiner

*Primary Examiner* — Matthew J Song
(74) *Attorney, Agent, or Firm* — Moser Taboada

(57) ABSTRACT

Embodiments of a blocker plate for use in a substrate process chamber are disclosed herein. In some embodiments, a blocker plate for use in a substrate processing chamber configured to process substrates having a given diameter includes: an annular rim; a central plate disposed within the annular rim; and a plurality of spokes coupling the central plate to the annular rim.

16 Claims, 2 Drawing Sheets

BLOCKER PLATE FOR USE IN A SUBSTRATE PROCESS CHAMBER

CROSS-REFERENCE TO RELATED APPLICATIONS

This application is a continuation of U.S. Pat. No. 10,508, 339, filed Jul. 29, 2017, which claims benefit of U.S. provisional patent application Ser. No. 62/513,149, filed May 31, 2017. Each of the aforementioned related patent applications is herein incorporated by reference in their entirety.

FIELD

Embodiments of the disclosure generally relate to methods and apparatus for substrate processing.

BACKGROUND

Atomic layer deposition (ALD) is a deposition technique used for the deposition of material layers over features formed on substrates. One example of an ALD process includes the sequential introduction of pulses of gases. For instance, one cycle for the sequential introduction of pulses of gases may contain a pulse of a first reactant gas, followed by a pulse of a purge gas and/or a pump evacuation, followed by a pulse of a second reactant gas, and followed by a pulse of a purge gas and/or a pump evacuation. A pulse of a purge gas and/or a pump evacuation between the pulses of the first reactant gas and the pulses of the second reactant gas serves to reduce the likelihood of gas phase reactions of the reactants due to excess amounts of the reactants remaining in the chamber.

The gases may be provided to the chamber through a showerhead including an inner blocker plate to distribute the gases within the showerhead prior to reaching the face of the showerhead, through which the gases enter the process chamber. Conventional blocker plates utilized in such chambers typically include many small holes used to distribute the precursors to within the showerhead. However, the inventors have observed that because of the high flow resistance exhibited from such blocker plates, the second precursor is often supplied before the first precursor is completely purged.

Therefore, the inventors have provided improved blocker plate for use in substrate processing chambers.

SUMMARY

Embodiments of a blocker plate for use in a substrate process chamber are disclosed herein. In some embodiments, a blocker plate for use in a substrate processing chamber configured to process substrates having a given diameter includes: an annular rim; a central plate disposed within the annular rim; and a plurality of spokes coupling the central plate to the annular rim.

In some embodiments, a substrate process chamber includes: a chamber body and a lid assembly defining a processing volume within the substrate process chamber; a substrate support disposed within the processing volume configured to support a substrate having a given diameter; a showerhead having a first surface including a plurality of gas distribution holes disposed opposite and parallel to the substrate support; and a blocker plate disposed above the showerhead. In some embodiments, the blocker plate includes: an annular rim; a central plate disposed within the annular rim; and a plurality of spokes coupling the central plate to the annular rim.

In some embodiments, a blocker plate for use in a substrate processing chamber configured to process a substrate having a given diameter includes: an annular rim having an inner diameter that is 0.9 to 1.1 times the given diameter; a central plate disposed within the annular rim and having a diameter between about 4 inches and about 6 inches; and four spokes coupling the central plate to the annular rim, wherein a width of each spoke is between about 0.1 inches and about 0.4 inches.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, that the appended drawings illustrate only typical embodiments of the disclosure and are therefore not to be considered limiting of scope, for the disclosure may admit to other equally effective embodiments.

Figure 1:
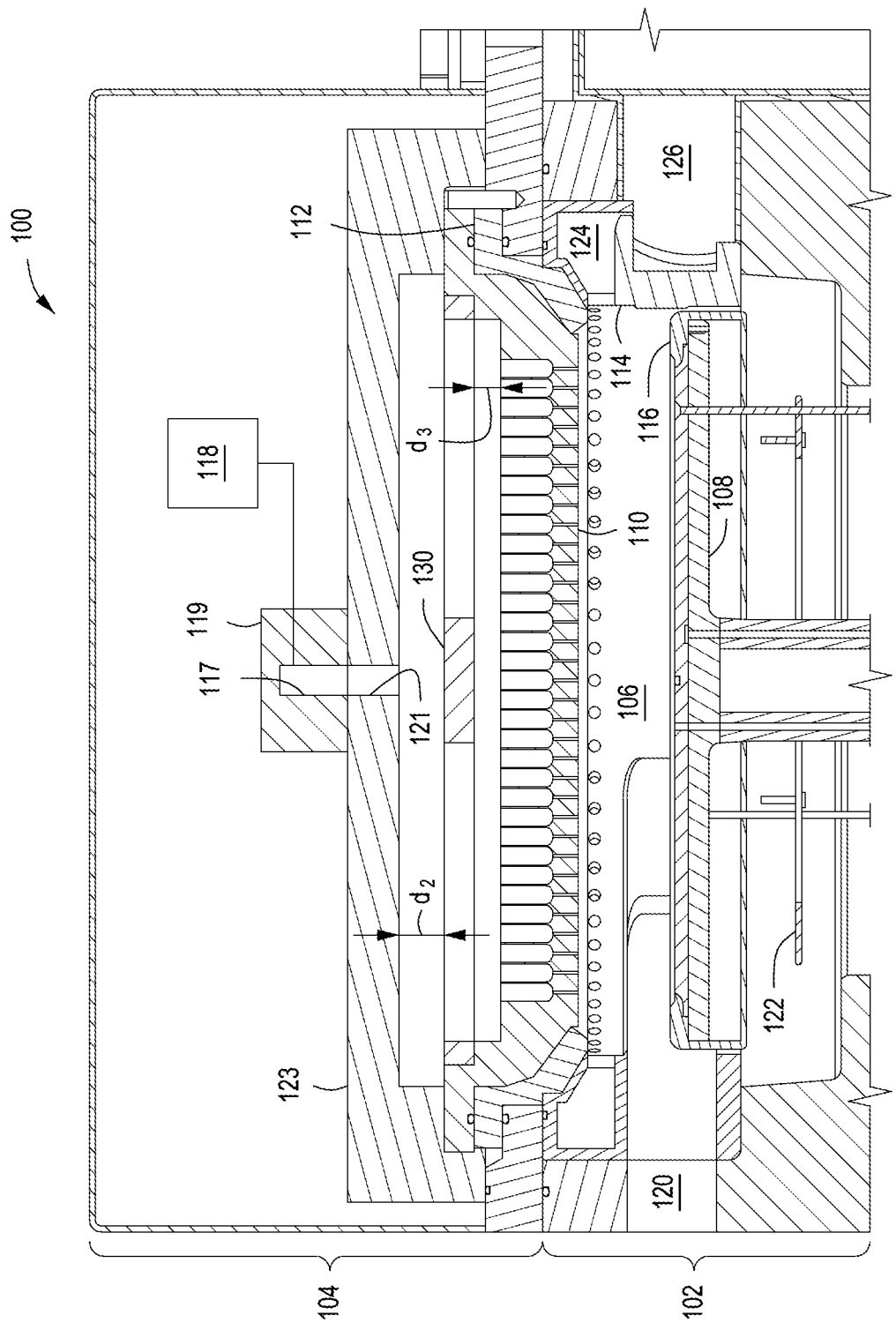
FIG. 1 depicts a schematic side cross-sectional view of a process chamber in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of the present disclosure provide a blocker plate for use in substrate process chambers, such as atomic layer deposition (ALD) process chambers (although process chambers for performing other processes may also benefit from the teachings disclosed herein). Embodiments include substrate processing chambers having a blocker plate as disclosed herein. Examples of suitable processing chambers for incorporation of the teachings described herein include ALD deposition chambers available from Applied Materials, Inc., of Santa Clara, Calif., although other chambers available from other manufacturers may also benefit. The following process chamber description is provided for context and exemplary purposes, and should not be construed as limiting the scope of the disclosure.

For example, the inventors have observed that undesirable reaction between first and second precursor gases provided to a process chamber can be limited or prevented, and the throughput of a process chamber improved, during ALD and chemical vapor deposition (CVD) processes.

FIG. 1 is a schematic view of a substrate processing chamber (process chamber 100) in accordance with some embodiments of the present disclosure. Process chamber 100 includes a chamber body 102 and a lid assembly 104 having a processing volume 106 defined within the chamber body 102 and beneath the lid assembly 104. A slit valve 120 in the chamber body 102 provides access for a robot (not shown) to deliver and retrieve a substrate, such as a 200, 300, 450 mm or the like semiconductor wafer, a glass substrate, or the like, to and from the process chamber 100.

A substrate support 108 supports a substrate on a substrate receiving surface in the process chamber 100. The substrate support 108 is mounted to a lift motor for raising and lowering the substrate support 108 and the substrate when disposed on the substrate support 108. A lift plate 122, connected to a lift motor, is mounted in the process chamber 100 to raise and lower lift pins movably disposed through the substrate support 108. The lift pins raise and lower the substrate over the surface of the substrate support 108. The substrate support 108 may include a vacuum chuck (not shown), an electrostatic chuck (not shown), or a clamp ring (not shown) for securing the substrate to the substrate support 108 during processing.

The temperature of the substrate support 108 may be adjusted to control the temperature of the substrate. For example, substrate support 108 may be heated using an embedded heating element, such as a resistive heater, or may be heated using radiant heat, such as heating lamps configured to provide heat energy to the substrate support 108.

In some embodiments, an edge ring 116 may be disposed atop a peripheral edge of the substrate support 108. The edge ring 116 includes a central opening sized to expose the support surface of the substrate support 108. The edge ring 116 may further include a skirt, or downwardly extending annular lip to protect the sides of the substrate support 108.

In some embodiments, a liner 114 is disposed along the interior walls (e.g., one or more sidewalls) of the chamber body 102 to protect the chamber body 102 from corrosive gases or deposition of materials during operation. In some embodiments, the liner 114 includes an inner volume 124 and a plurality of openings to fluidly couple the inner volume 124 to the processing volume 106. In such embodiments, the inner volume 124 of the liner 114 is further fluidly coupled to a pumping channel 126 to facilitate evacuation of gases from the process chamber 100 and maintaining a predetermined pressure or pressure range inside the process chamber 100 via a vacuum pump coupled to the pumping channel 126.

A gas delivery system 118 is coupled to a central conduit 117 of a manifold 119 of the lid assembly 104 to provide a gas, such as a process gas and/or a purge gas, to a central opening 121 of a top plate 123 to supply the gas to the processing volume 106 through a showerhead 110. In some embodiments, the gas delivery system 118 may be a remote plasma source. In some embodiments, the top plate 123 may include channels (not shown) for flowing a heat transfer medium to control the temperature of the top plate 123. The showerhead 110 is disposed in the lid assembly 104 generally opposite the substrate support 108 and includes a plurality of gas distribution holes to provide process gases to the processing volume 106. In some embodiments, a spacer 112 may be provided to control the position of the showerhead 110 with respect to the substrate support 108 (e.g., the distance between the front face of the showerhead 110 and the support surface of the substrate support 108). For example, in some embodiments, the spacer 112 may be an annular member disposed between the showerhead 110 and a support member in the lid assembly 104. The dimensions of the spacer 112, for example the thickness, may be selected to control the position of the showerhead 110 when resting atop the spacer 112. A blocker plate 130 is disposed above the showerhead 110 to improve deposition uniformity by diffusing the flow of gas at the center of the showerhead 110 and allowing for a more uniform flow of gas through the showerhead 110. In some embodiments, a first vertical distance $d_3$ between the blocker plate 130 and the showerhead 110 may be between about 0.1 inches and about 0.4 inches.

Figure 2:
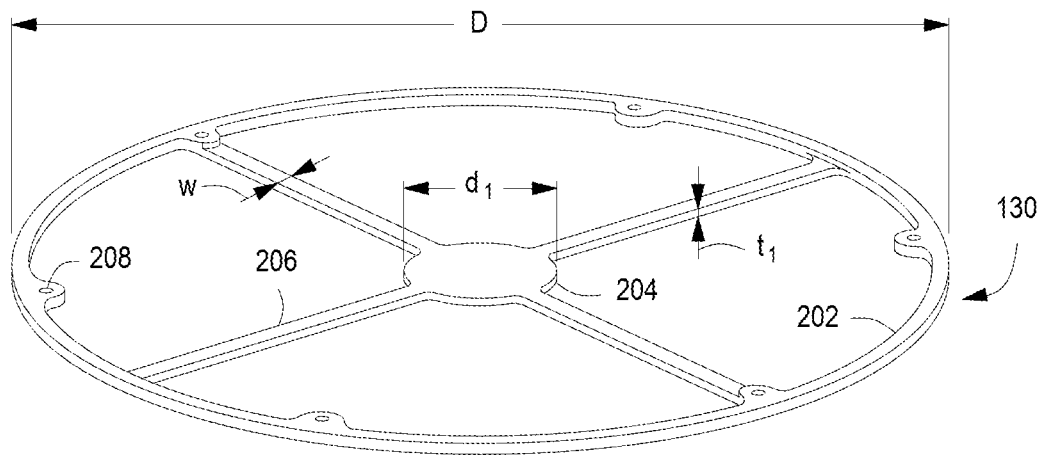
FIG. 2 depicts an isometric view of a blocker plate in accordance with some embodiments of the present disclosure.

FIG. 2 depicts an isometric view of the blocker plate 130 in accordance with some embodiments of the present disclosure. In some embodiments, the blocker plate 130 includes an annular rim 202 configured to sit on a ledge disposed within the showerhead 110, (as depicted in FIG. 1). In some embodiments, the blocker plate is advantageously designed to be used in a process chamber configured to process substrates having a given diameter, such as about 150 mm, 200 mm, 300 mm, 450 mm, or other sizes commonly used in the semiconductor industry). As used herein, configured to process substrates having a given diameter, or configured to support a substrate having a given diameter, means that the process chamber and substrate supports are explicitly designed and structurally configured to process and support the substrate having the given diameter. In some embodiments, the inner diameter of the annular rim 202 is 0.9 to 1.1 times the given diameter. The outer, or overall diameter (D) of the blocker plate 130 can be about 0.5 inches to about 1.5 inches larger than the inner diameter. In some embodiments, the overall diameter D of the blocker plate 130 is greater than the diameter of a substrate being processed. In some embodiments, the width of the annular rim 202 is between about 0.1 inches and about 0.4 inches.

The blocker plate 130 further includes a central plate 204 having a first diameter $d_1$, and a plurality of spokes 206 that couple the central plate 204 to the annular rim 202. In some embodiments, the first diameter $d_1$ is between about 4 inches and about 6 inches. In some embodiments, the plurality of spokes 206 are four spokes, as depicted in FIG. 2. However, the blocker plate 130 may alternatively have fewer or more spokes. For example, the blocker plate 130 can have between 3 and 6 spokes. Each of the spokes has a width w between about 0.1 inches and about 0.4 inches.

Figure 3:
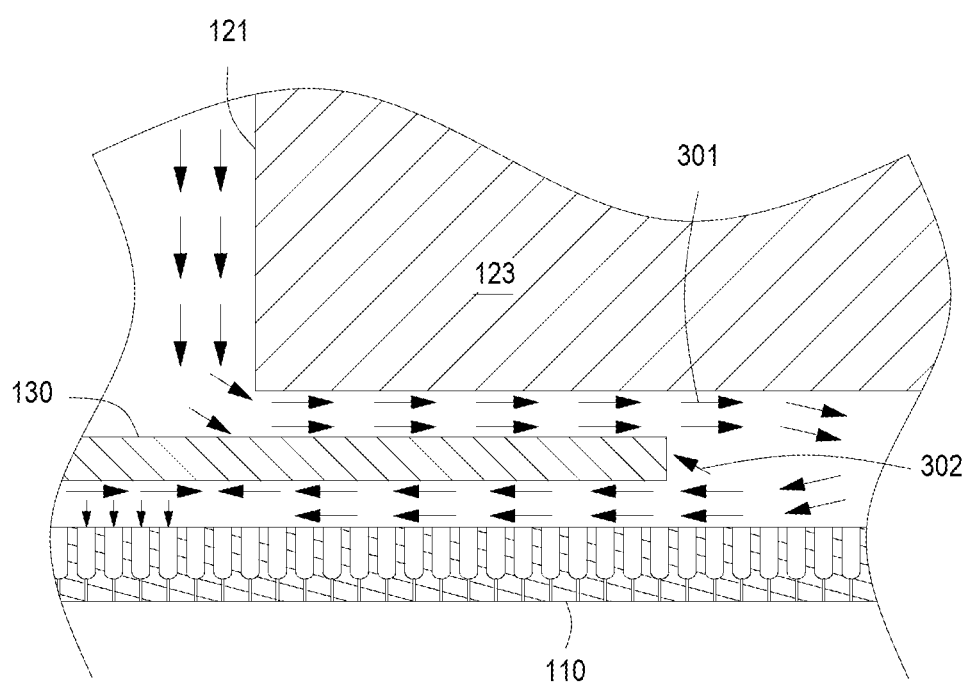
FIG. 3 depicts a schematic cross-sectional view of blocker plate in accordance with some embodiments of the present disclosure.

As illustrated in the cross-sectional flow diagram of FIG. 3, when gas flows through the central opening 121, the gas subsequently hits the central plate 204 and flows radially outward, forming a horizontal jet 301. As the gas moves further away from the central opening 121, the velocity of the gas progressively decreases and the gas to slowly moves downward toward the showerhead 110 until the gas hits the showerhead. Afterwards, the incoming gas pushes the gas already present between the top plate 123 and the showerhead 110 radially inward beneath the blocker plate 130 and through the showerhead 110. The inventors have discovered that the diameter $d_1$ of the central plate 204 must be chosen to prevent entrainment of the flow of gas back into the gas flow above the central plate 204. That is, the pressure within the horizontal jet 301 above the central plate 204 is less than the pressure outside of the horizontal jet. The pressure difference drives the gas surrounding the jet back into the jet, as depicted by arrow 302 in FIG. 3. The inventors have discovered that a diameter $d_1$ between about 4 inches and about 6 inches advantageously minimizes or eliminates entrainment. If the diameter $d_1$ is less than about 4 inches, increased entrainment occurs. If the diameter $d_1$ is greater than about 6 inches, gas must travel a further distance to reach the center of the showerhead 110, thus resulting in decreased deposition at the center of the substrate being processed. The relative dimensions of the central plate 204 and the overall diameter D are advantageously configured to minimize entrainment and ensure more uniform deposition on the substrate being processed. The inventors have also discovered that a second vertical distance $d_2$ between the blocker plate 130 and the top plate 123 affects the velocity of the horizontal jet 301. As such, the vertical distance $d_2$ between the blocker plate 130 and the top plate 123 is advantageously between about 0.02 inches and about 0.15 inches to control the velocity of the horizontal jet 301.

Returning to FIG. 2, in some embodiments, the blocker plate 130 includes a plurality of openings 208 through which a fixation element (such as a bolt or the like) may extend to couple the blocker plate 130 to the showerhead 110. In some embodiments, the openings 208 are formed in a corresponding plurality of protrusions that extend radially inward from the annular rim 202. In some embodiments, the plurality of openings 208 is six openings. The openings 208 can be equidistantly spaced. In some embodiments, the blocker plate 130 is formed of aluminum. In some embodiments, the blocker plate 130 is formed of quartz. In some embodiments, a thickness t1 of the blocker plate is between about 0.05 inches and about 0.25 inches.

In an illustrative processing operation, a substrate is delivered to the process chamber 100 through the slit valve 120 by a robot (not shown). The substrate is positioned on the substrate support 108 through cooperation of the lift pins and the robot. The substrate support 108 raises substrate into close opposition to a lower surface of the showerhead 110. A first gas flow may be injected into the processing volume 106 by the gas delivery system 118 together or sequentially (e.g., in pulses) with a second gas flow. The first gas flow may contain a continuous flow of a purge gas from a purge gas source and pulses of a reactant gas from a reactant gas source or may contain pulses of a reactant gas from the reactant gas source and pulses of a purge gas from the purge gas source. The second gas flow may contain a continuous flow of a purge gas from a purge gas source and pulses of a reactant gas from a reactant gas source or may contain pulses of a reactant gas from a reactant gas source and pulses of a purge gas from a purge gas source. The gas is then deposited on the surface of substrate. Excess gas, by-products, and the like flow through the inner volume 124 of the liner 114 to the pumping channel 126 and are then exhausted from process chamber 100.

While the foregoing is directed to some embodiments of the present disclosure, other and further embodiments may be devised without departing from the basic scope thereof.

What is claimed is:

1. A blocker plate for use in a substrate processing chamber configured to process substrates having a given diameter of at least 5.9 inches, comprising:
    an annular rim having an inner diameter that is 0.9 to 1.1 times the given diameter;
    a central plate having no holes disposed within the central plate and having a diameter of about 4 inches to about 6 inches;
    four spokes coupling the central plate to the annular rim, wherein a width of each spoke is about 0.1 inches to about 0.4 inches; and
    a plurality of protrusions extending radially inward from the annular rim toward the central plate without abutting the central plate, wherein at least one protrusion is aligned with the four spokes, and wherein each protrusion of the plurality of protrusions includes an opening.

2. The blocker plate of claim 1, wherein the blocker plate is formed of aluminum or quartz.

3. The blocker plate of claim 1, wherein the blocker plate has a thickness of about 0.05 inches and about 0.25 inches.

4. The blocker plate of claim 1, wherein there is exactly one protrusion of the plurality of protrusion disposed between adjacent ones of the four spokes.

5. The blocker plate of claim 1, wherein at least one of the plurality of protrusions extend radially inward from the annular rim between adjacent ones of the four spokes.

6. The blocker plate of claim 1, wherein an overall diameter of the blocker plate is about 0.5 inches to about 1.5 inches larger than the inner diameter of the blocker plate.

7. The blocker plate of claim 1, wherein one of the plurality of protrusions extend radially inward from the annular rim above one of the four spokes.

8. A blocker plate for use in a substrate processing chamber configured to process a substrate having a given diameter of at least 5.9 inches, comprising:
    an annular rim having an inner diameter that is 0.9 to 1.1 times the given diameter;
    a central plate having no holes disposed within the central plate and having a diameter of about 4 inches to about 6 inches; and
    four spokes coupling the central plate to the annular rim, wherein a width of each spoke is about 0.1 inches to about 0.4 inches.

9. A substrate process chamber, comprising:
    a showerhead having a plurality of gas distribution holes; and
    the blocker plate of claim 8 disposed above the showerhead.

10. The substrate process chamber of claim 9, further comprising:
    wherein the plurality of protrusions include an opening configured to facilitate coupling the blocker plate to the showerhead.

11. The blocker plate of claim 8, wherein the blocker plate has a thickness of about 0.05 inches to about 0.25 inches.

12. The blocker plate of claim 8, wherein the blocker plate is formed of aluminum or quartz.

13. The blocker plate of claim 8, wherein an overall diameter of the blocker plate is about 0.5 inches to about 1.5 inches larger than an inner diameter of the blocker plate.

14. The blocker plate of claim 8, wherein a plurality of protrusions extend radially inward from the annular rim toward the central plate without abutting the central plate.

15. The blocker plate of claim 14, wherein at least one of the plurality of protrusions extends radially inward from the annular rim above one of the four spokes.

16. The blocker plate of claim 14, wherein at least one of the plurality of protrusions extend radially inward from the annular rim between adjacent spokes of the four spokes.

* * * * *